(12) United States Patent
Ramcke et al.

(10) Patent No.: US 6,490,190 B1
(45) Date of Patent: Dec. 3, 2002

(54) MEMORY CELL CONFIGURATION, MAGNETIC RAM, AND ASSOCIATIVE MEMORY

(75) Inventors: Ties Ramcke, München (DE); Wolfgang Rösner, München (DE); Lothar Risch, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/528,159

(22) Filed: Mar. 17, 2000

Related U.S. Application Data

(63) Continuation of application No. PCT/DE98/02589, filed on Sep. 2, 1998.

(30) Foreign Application Priority Data

Sep. 17, 1997 (DE) ......................................... 197 40 942

(51) Int. Cl.[7] .............................................. G11C 11/00
(52) U.S. Cl. ..................... 365/158; 365/173; 365/205; 365/207
(58) Field of Search ................................. 365/158, 173, 365/171, 205, 207, 189.07

(56) References Cited

U.S. PATENT DOCUMENTS

| | | | |
|---|---|---|---|
| 5,173,873 A | 12/1992 | Wu et al. ..................... | 365/173 |
| 5,432,734 A | 7/1995 | Kawano et al. ............. | 365/158 |
| 5,640,343 A | 6/1997 | Gallagher et al. .......... | 365/171 |
| 5,838,608 A | * 11/1998 | Zhu et al. .................... | 365/158 |
| 5,872,739 A | * 2/1999 | Womack ..................... | 365/207 |

FOREIGN PATENT DOCUMENTS

| EP | 0 613 148 A2 | 8/1994 |
|---|---|---|
| EP | 0 685 849 A2 | 12/1995 |

OTHER PUBLICATIONS

International Publication WO 99/18578 (Schwarzl et al.), dated Apr. 15, 1999.
"Halbleiter–Schaltungstechnik" (Tietze et al.), Springer Verlag, dated 1990, pp. 134–137, pertains to a semiconductor circuit engineering.
"High Density Nonvolatile Magnetoresistive RAM" (Tehrani et al.), dated 1996, Motorola Inv. Phoenix Corporate Research Laboratories, pp. 7.7.1–7.7.4.
"Spin–Valve RAM Cell" (Tang et al.), dated Nov. 1995, IEEE Transactions on Magnetics, vol. 31, No. 6.
"An IC process compatible Nonvolatile Magnetic RAM" (Tang et al.), IBM Almaden Research Center, IEDM 95/997, pp. 5.7.1–5.7.3.
"6.1.5.2 Assoziative Speicher" (Prof. Karl Goser), pp. 173–174, pertains to associative storages.
"VLSI Technologies for Artificial Neural Networks" (Goser et al.), dated 1989, IEEE Micro, pp. 28–44.

* cited by examiner

Primary Examiner—Richard Elms
Assistant Examiner—VanThu Nguyen
(74) Attorney, Agent, or Firm—Laurence A. Greenberg; Werner H. Stemer; Ralph E. Locher

(57) ABSTRACT

A memory cell configuration has word lines and bit lines that extend transversely with respect thereto. Memory elements with a giant magnetoresistive effect are respectively connected between one of the word lines and one of the bit lines. The bit lines are each connected to a sense amplifier by means of which the potential on the respective bit line can be regulated to a reference potential and at which an output signal can be picked off. The memory cell configuration can be used both as an MRAM and as an associative memory.

12 Claims, 4 Drawing Sheets

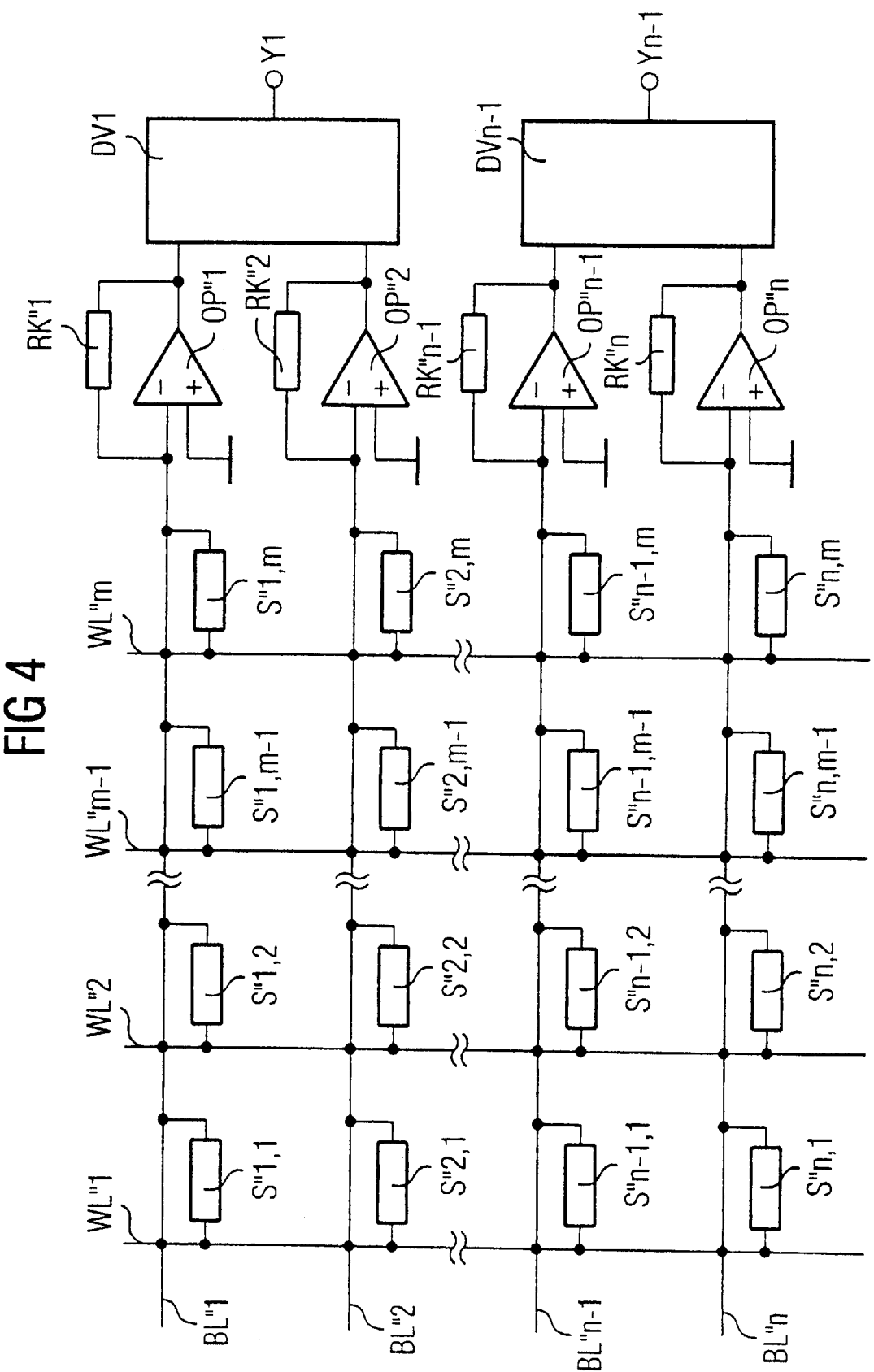

MEMORY CELL CONFIGURATION, MAGNETIC RAM, AND ASSOCIATIVE MEMORY

CROSS-REFERENCE TO RELATED APPLICATION

This is a continuation of copending international application PCT/DE98/02589, filed Sep. 2, 1998, which designated the United States.

BACKGROUND OF THE INVENTION

Field of the Invention

The invention relates to a memory cell configuration with memory elements having a layer structure with a giant magnetoresistive effect (GMR).

The term GMR element is used in the pertinent art for layer structures which have at least two ferromagnetic layers and a non-magnetic layer arranged in between and exhibit the so-called GMR (giant magnetoresistive) effect. The GMR effect encompasses the fact that the electrical resistance of the GMR element is dependent on whether the magnetization in the two ferromagnetic layers is oriented in a parallel or antiparallel.

It has been proposed (see, for example, D. D. Tang et al., IEDM 95, pages 997–99; D. D. Tang et al., IEEE Trans. on Magnetics, Vol. 31, No. 6, 1995, pages 3206–08; F. W. Patten et al., Int. Non Volatile Memory Technology Conf., 1996, pages 1–2) to use such GMR elements as memory elements in a memory cell configuration. For this purpose, GMR elements in which the magnetization direction of one ferromagnetic layer is fixed for example by an adjacent antiferromagnetic layer are used as memory elements. The memory elements are connected in series via bit lines. Word lines run transversely with respect to the latter and are insulated from both the bit lines and the memory elements. Signals applied to the word lines cause a magnetic field as a result of the current flowing in the word line. The magnetic field influences the memory elements situated underneath. In order to write information, signals are applied to a bit line and a word line, which intersect above the memory cell to be written to. At the point of intersection, the signals cause a magnetic field which is sufficient for the magnetization reversal. In order to read the information, a pulsed signal is applied to the word line. The pulsed signal switches the relevant memory cell back and forth between the two magnetization states. The current through the bit line is measured and the resistance of the corresponding memory element is determined from the measured current. S. Tehrani et al. IEDM 96, pages 193 ff., have proposed using a GMR element having ferromagnetic layers of different thicknesses as the memory element. The magnetic field for writing information is dimensioned such that it only influences the magnetization in the thinner of the two ferromagnetic layers. The magnetization in the thicker of the two ferromagnetic layers remains uninfluenced by it.

It is an obvious drawback that the read-out operation with pulsed signals requires an increased outlay on circuitry in these memory cell configurations.

SUMMARY OF THE INVENTION

It is accordingly an object of the invention to provide a memory cell configuration with GMR elements, which overcomes the above-mentioned disadvantages of the heretofore-known devices and methods of this general type and which can be read with a reduced outlay on circuitry.

With the foregoing and other objects in view there is provided, in accordance with the invention, a memory cell configuration, comprising:

a plurality of substantially parallel word lines and a plurality of substantially parallel bit lines running transversely to the bit lines; memory elements having a layer structure with a giant magnetoresistive effect, the memory elements being respectively connected between one of the word lines and one of the bit lines and having a higher resistance than the word lines and the bit lines;

a sense amplifier connected to each of the bit lines for regulating a potential on a respective the bit line to a reference potential and outputting an output signal.

In accordance with an added feature of the invention, the sense amplifier has a feedback operational amplifier.

In other words, the memory cell configuration has word lines bit lines traversing the word lines. Memory elements having a layer structure with a very large magnetoresistive effect (GMR), that is to say GMR elements, are provided. The GMR elements are respectively connected between one of the word lines and one of the bit lines and have a higher resistance than the word lines and the bit lines. The bit lines are each connected to a sense amplifier by means of which the potential on the respective bit line can be regulated to a reference potential and at which an output signal can be picked off. In order to read this memory cell configuration, all the word lines which are not selected are put at the reference potential. A signal with a different potential is applied to the selected word line. A current path from the selected word line to all the bit lines is closed as a result of this. The resistance of the memory element situated at the point of intersection of the word line with the respective bit line can be determined from the output signal at the respective sense amplifier, the electrical characteristic parameters of the sense amplifier, such as the feedback resistance, for example, and the reference potential and the bit line resistance. A pulsed signal is not necessary, therefore, in order to read this memory cell configuration.

The sense amplifier preferably has a feedback operational amplifier. The non-inverting input of the operational amplifier is connected to reference potential, for example to ground. The bit line is connected to the inverting input. If the reference potential is 0 volts, then this operational amplifier ensures that 0 volts are present on the bit line. The output signal of the operational amplifier is a measure of the resistance of the selected memory element.

All known GMR elements are suitable as the memory element, provided that they have a higher resistance than the bit line and the word line in both magnetization states. The GMR effect is greater if the current flows perpendicularly through the layer stack than if the current flows in parallel into the layers.

In accordance with an additional feature of the invention:
the memory elements each have two ferromagnetic layers and a non-magnetic layer arranged between the two ferromagnetic layers;
an antiferromagnetic layer is disposed adjacent to one of the ferromagnetic layers and determines a polarization direction of a magnetization in the adjacent ferromagnetic layer; and
the memory elements each have two magnetization states.

It is advantageous to use an insulating, non-magnetic layer since the GMR effect, which is brought about by a spin-polarized tunneling current through the insulating, non-magnetic layer arranged between the two ferromagnetic layers, is much greater in these structures than if a non-insulating, non-magnetic layer is used. The different resistances assigned to two different logic values 0 and 1 in the memory cell configuration can be better distinguished as a result of this.

As an alternative, the memory elements may each have two ferromagnetic layers and a non-magnetic layer arranged in between, one of the ferromagnetic layers being thicker than the other ferromagnetic layer or the ferromagnetic layers being formed from different materials with different magnetic properties, or have a non-magnetic, non-insulating layer.

Materials containing at least one of the elements Fe, Ni, Co, Cr, Mn, Gd are suitable, inter alia, for the ferromagnetic layers. The thickness of the ferromagnetic layers is at most 20 nm and preferably lies in the range between 2 and 10 nm. The oxides $Al_2O_3$, NiO, $HfO_2$ or $TiO_2$, NbO, $SiO_2$ are all suitable as insulating material for the non-magnetic layer, which acts as a tunnelling insulator. Cu or Ag is suitable as non-insulating material for the non-magnetic layer. The thickness of the non-magnetic layer lies in the range between 1 and 4 nm, preferably between 2 and 3 nm.

In order to write information to one of the memory elements, a respective signal is applied to the associated word line and to the associated bit line. As a result, a current flows via the word line and the bit line and induces a magnetic field in each case. At the point of interception of the word line and bit line, the total magnetic field resulting from superposition of the two magnetic fields is large enough to ensure magnetization reversal of the memory element situated there. Outside the point of intersection, the individual magnetic fields are too small for magnetization reversal of the memory elements situated there.

In applications where an increased magnetic field is necessary or desirable for the purpose of writing, it lies within the scope of the invention to additionally provide write lines running essentially parallel to one another, which write lines run parallel to the bit lines, for example. These write lines are insulated from the word lines and the bit lines. By applying a signal to the corresponding write line, it is possible to amplify the magnetic field at the point of intersection with the selected word line and thus to support the writing operation.

The memory cell configuration is suitable as a magnetic RAM (MRAM).

Furthermore, the memory cell configuration can be operated as an associative memory. For this purpose, a respective threshold value element is provided with regard to the bit lines, which element is connected to the output of the sense amplifier of the respective bit line.

In an associative memory, as disclosed for example in K. Goser et al., IEEE Micro, 9 (1989) 6, pages 28–44, an input signal is applied simultaneously to all the word lines. The input signal has as many places as word lines. The current is summed at each of the bit lines and the output signal is formed with a threshold value element. In the associative memories disclosed in Goser et al., IEEE Micro, 9 (1986) 6, pages 28–44, the memory cell comprises only a conventional resistor or a transistor and is connected between intersecting word lines and bit lines. These conventional resistors and transistors cannot be altered during operation, with the result that the memory is not capable of learning. As an alternative, the memory cells are realized as EEPROM cells, thereby enabling programming, which are more complicated to fabricate, however.

One advantage of the memory cell configuration according to the invention when used as an associative memory is that the GMR elements in the memory elements can be reprogrammed as often as desired during operation. Therefore, the associative memory can learn information during operation.

In accordance with a further embodiment of the invention, a differential amplifier is provided with regard to two bit lines in each case. The inputs of the differential amplifier are in each case connected to the output of the sense amplifiers of the associated bit lines. This memory cell configuration is preferably likewise used as an associative memory, the memory elements in the two bit lines which are connected to the same word line in each case being programmed complementarily with respect to one another. During read-out, there is formed on one bit line the complementary signal of the other. The output signal is formed from these complementary signals in the differential amplifier. This differential method considerably improves the interference immunity in respect of processed fluctuations.

Other features which are considered as characteristic for the invention are set forth in the appended claims.

Although the invention is illustrated and described herein as embodied in a memory cell configuration and its use as a magnetic RAM and as an associative memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a diagram showing an associative memory in which two adjacent bit lines are in each case programmed complementarily and connected to a differential amplifier.

DESCRIPTION OF THE PREFERRED EMBODIMENTS

Figure 1:
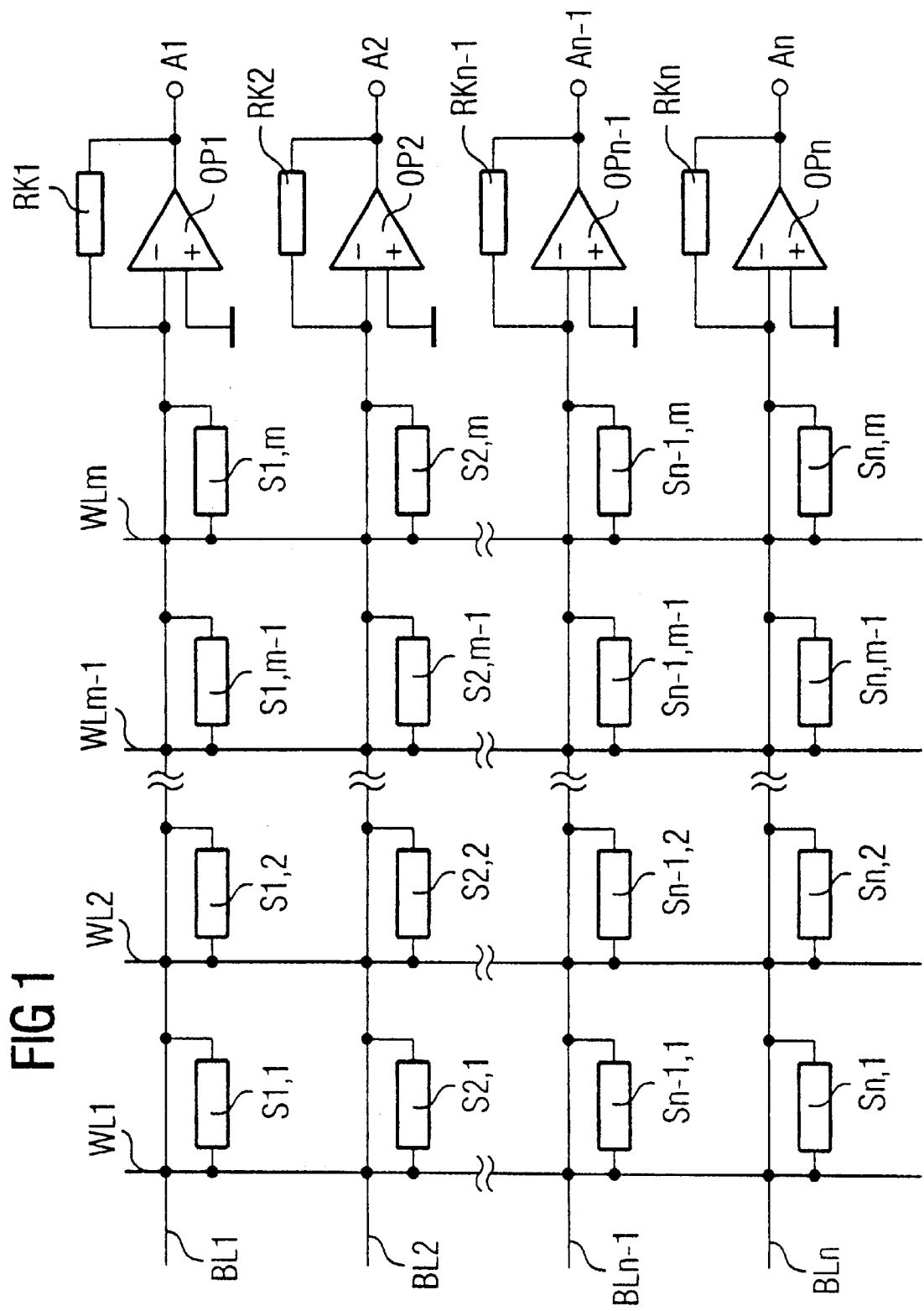
FIG. 1 is a diagram showing the architecture of an MRAM configuration.

Referring now to the figures of the drawing in detail and first, particularly, to FIG. 1 thereof, there is shown a memory cell configuration with bit lines BLi, i=1, 2, . . . n running essentially parallel to one another. Word lines WLj, j=1, 2, . . . m run transversely with respect to the bit lines BLi. The word lines WLj likewise run essentially parallel to one another. A memory element Si,j is arranged at each of the points of intersection of the bit lines BLi with the word lines WLj.

The bit lines BLi are each connected to the inverting input of an operational amplifier OPi, i=1, 2 . . . n. The non-inverting input of the operational amplifier OPi is connected to ground potential. The operational amplifiers OPi have feedback and each have a feedback resistor RKi. The operational amplifiers OPi each have an output Ai.

Figure 2:
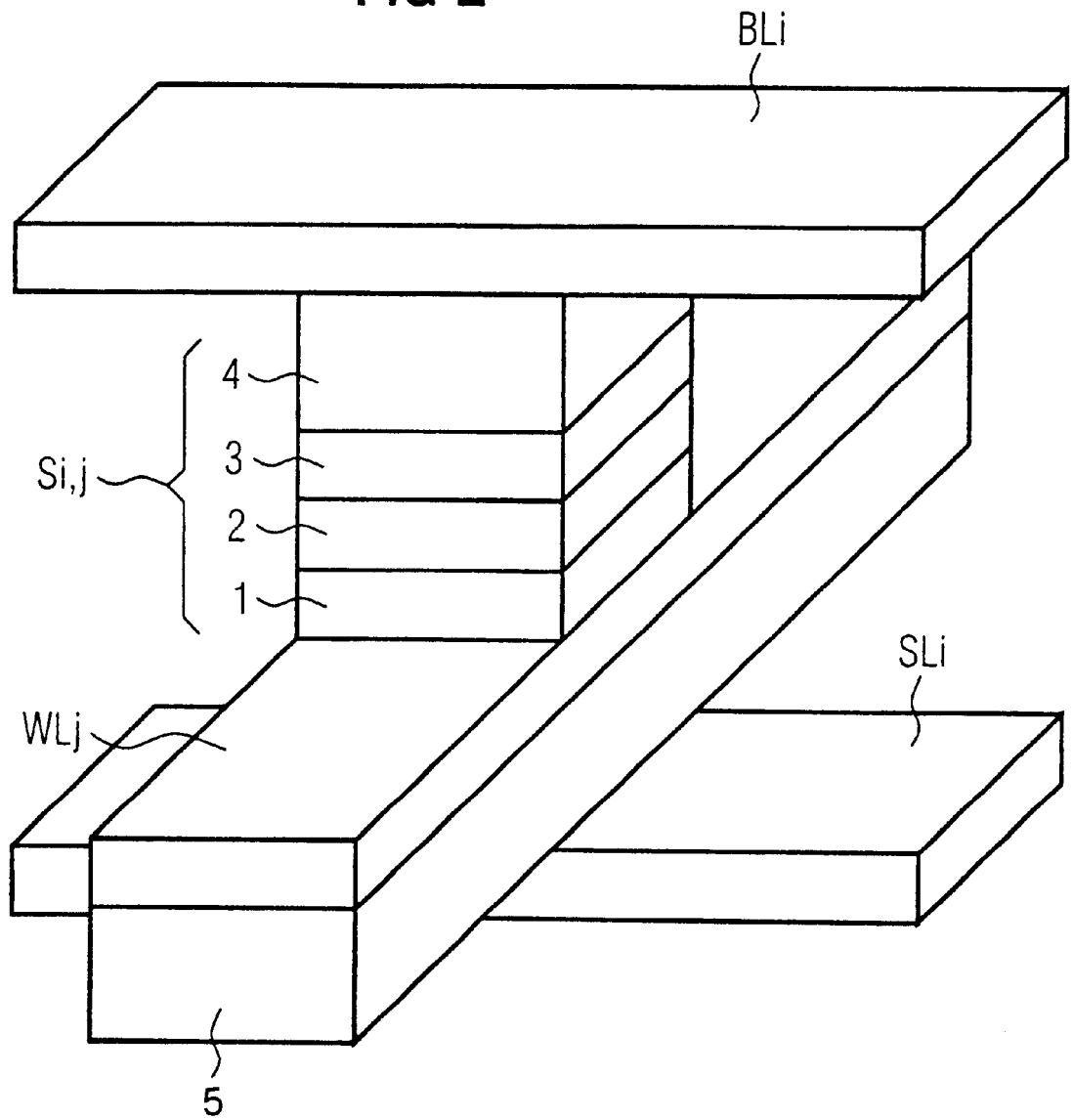
FIG. 2 is a diagrammatic perspective view of a memory element with an associated bit line, word line, and write line.

Referring now to FIG. 2, the memory elements Si,j each have a first ferromagnetic layer 1, a non-magnetic layer 2, a second ferromagnetic layer 3 and an antiferromagnetic layer 4. The first ferromagnetic layer 1, the non-magnetic layer 2 and the second ferromagnetic layer 3 constitute a layer structure. The first ferromagnetic layer 1 and the second ferromagnetic layer 3 contain NiFe, for example, and have a thickness of 10 nm. The non-magnetic layer 2 contains $Al_2O_3$ and has a thickness of 2 to 3 nm. The antiferromagnetic layer 4 contains FeMn and has a thickness of 10 to 20 nm. In the plane spanned by the bit lines BLi and the word lines WLj, the memory elements Si,j each have a cross section of 0.25 μm×0.25 μm, for example.

The bit lines BLi and the word lines WLi are each formed from Al, Cu with a thickness that is dimensioned to result in a current density that does not exceed $10^6$ A/cm² in the Al.

The first ferromagnetic layer 1 adjoins the word line WLj. The antiferromagnetic layer 4 adjoins the bit line BLi. The bit line BLi runs above the word line WLj. As an alternative, the bit lines BLi may also run below the word lines WLj.

An insulating layer 5 made, for example, of $SiO_2$ with a thickness of 10 nm is arranged underneath the word lines WLj. It insulates the word line WLj from a write line SLi running transversely with respect thereto. The write lines SLi, i=1 . . . n run essentially parallel to one another. The write line SLi runs below the bit line BLi.

In this memory cell configuration, one of the resistances of the memory elements Si,j is respectively assigned to the logic values zero and one.

In order to read out the information stored in the memory cell configuration, the word line WLj is driven in order to read out the information stored in the memory element Si,j. For this purpose, the word line WLj is put at a potential of +1 V, for example. All the other word lines WLl, l≠j, are put at 0 volts. All the bit lines BLi, i=1 . . . n are likewise at 0 volts since they are connected to the inverting input of the feedback operational amplifier OPi, which constantly regulates itself to 0 volts. A voltage $$U_{out} = 1V * \frac{R}{(Rx + Rl)}$$

is picked off at the output Ai of the operational amplifier OPi, where R is the resistance of the feedback resistance RKi, Rx is the resistance of the memory Si,j and Rl is the resistance of the line portions of the word line WLj and of the bit line BLi via which the current flows. The resistance Rx of the memory element Si,j can be calculated from this voltage, since the remaining parameters are known.

The bit lines BLi and the word lines WLj are formed from metal. Consequently, their resistance is very small. The feedback resistor RKi has a resistance of 100 kΩ, for example. The resistance Rx of the memory element Si,j is approximately 100 kΩ if the magnetization of the first ferromagnetic layer 1 and of the second ferromagnetic layer 3 is oriented in a parallel manner, and 110 kΩ if the magnetization of the first ferromagnetic layer 1 and of the second ferromagnetic layer 3 is oriented in an antiparallel manner. 100 bit lines BLi and 10,000 word lines WLj are provided. The change in the input signal is thus 100 mV, depending on the assumed resistance of the memory element Si,j. With a resistance ratio R/(Rx+Rl) of 10, the change can be amplified to 1 volt at the output Ai of the operational amplifier OPi.

Since all the bit lines BLi are at 0 volts, no parasitic currents flow between the bit lines BLi. The current path is closed only between the selected word line WLj and all the bit lines. It is advantageous, therefore, to use a larger number of word lines WLj than bit lines BLi. A 1 Mbit memory cell configuration is preferably constructed with n=100 bit lines BLi and m=10,000 word lines WLj. As a result, only 100 sense amplifies are necessary.

The current which respectively flows into the selected word lines BLj results from the connection in parallel of 100 memory elements Si,j. Each has a resistance of approximately 100 kΩ. This parallel circuit has a resistance of approximately 1 kΩ. The length of the bit lines BLi is unimportant here since this is not subjected to charge reversal.

In order to write information to the memory cell Si,j, a current in the mA order of magnitude is respectively impressed on the write line SLi and the word line WLj. This current induces a magnetic field in each case around the write line SLi and the word line WLj. That magnetic field influences the magnetization of the first ferromagnetic layer 1 at the point of intersection of the write line SLi and the word line WLj. The magnetization of the second ferromagnetic layer 3 is fixed by the antiferromagnetic layer 4 adjacent to it.

As an alternative, the write lines SLi run parallel to the word lines WLj. In this case, the bit line BLi and the write line are driven in order to write information.

Figure 3:
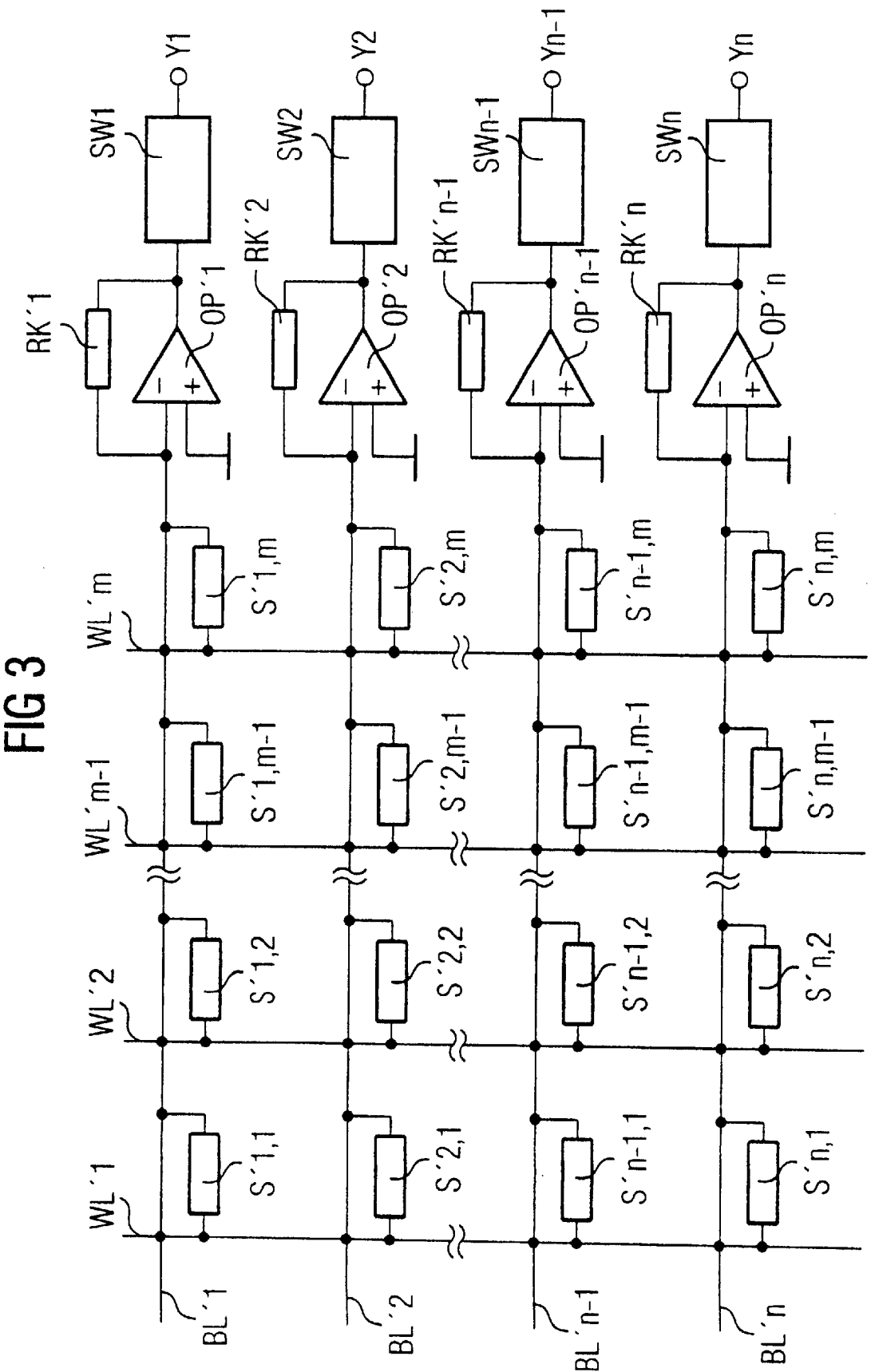
FIG. 3 is a diagram showing an associative memory in which each bit line is connected to a threshold value element.

Referring now to FIG. 3, there is shown a memory cell configuration which can be used as an associative memory. Word lines WL'j, j=1 . . . m run parallel to one another and bit lines BL'i, I=1 . . . n run essentially parallel to one another and run transversely with respect to the word lines. A memory element S'i,j is arranged in each case at the point of intersection of the bit lines BL'i with the word lines WL'j. The memory elements S'i,j are constructed analogously to the memory elements Si,j which have been explained with reference to FIG. 2. The bit lines BL'i are each connected to the inverting input of an operational amplifier OP'i, whose non-inverting input is connected to ground potential and which has feedback. The operational amplifiers OP'i have a feedback resistor RK'i. The output of the operational amplifiers OP'i is connected to the input of a threshold value element SWi. An operational amplifier having a very high gain, for example ≧100, or a Schmitt trigger is suitable, for example, as the threshold value element SWi. The operational amplifiers OP'i are dimensioned analogously to the OP amps of the exemplary embodiment explained with reference to FIGS. 1 and 2.

The memory elements S'i,j are freely programmable. For this purpose, current flows through the bit line BL'i and the word line WL'j. In this case, magnetic fields are induced around the bit line BL'i and the word line WL'j. The currents are chosen such that the resulting magnetic field at the point of intersection of the bit line BL'i and word line WL'j at which the memory element S'i,j is arranged changes the magnetization of the first ferromagnetic layer of the memory element S'i,j and hence the resistance of the memory element S'i,j. At the same time, at all the other memory elements of the bit line BL'i and word line WL'j, the magnetic field does not suffice to change the magnetization and hence the resistance. Depending on the current direction, the larger or the smaller value of the resistance is thus programmed into the memory element S'i,j.

In order to read the memory cell configuration, a signal in the form of an input vector X with m components is applied to the word lines WL'j, j=1 . . . m. The components of X in this case assume the values 0 volts or Vdd. Vdd is 1 volt, for example. A current flows into the bit line BL'i via the memory elements S'i,j, j=1 . . . m. The sum of these currents flows through the feedback resistor RK'i, since the operational amplifier OP'i has a very high input resistance, for example ≧100 megaohms, and a voltage Ui such that the bit line BL'i is regulated to 0 volts. From the voltages Ui of the operational amplifier OP'i, the threshold value elements SWi form output variables Yi, which may assume the values 0 volts or Vdd.

A further memory cell configuration, which is likewise suitable as an associative memory, has word lines WL"j, j=1 . . . m running essentially parallel to one another and bit lines BL"i, i=1 . . . n running essentially parallel to one another and running transversely with respect to the said word lines (see FIG. 4). A memory element S"i,j is arranged in each case at the points of intersection of the bit lines BL"i and word lines WL"j, which memory element is constructed in a manner analogous to that in the exemplary embodiment described above. The bit lines BL"i are each connected to the inverting input of an operational amplifier OP"i, whose non-inverting input is at ground potential and which has feedback. The operational amplifiers OP"i have a feedback resistor RK"i. The output of the operational amplifiers OP"i, OP"i+1 of adjacent bit lines BL"i, BL"i+1 are connected to the inputs of a differential amplifier DVi, i=1, 3, 5, . . . n−1 (see FIG. 4).

Information is written to this memory cell configuration in a manner analogous to that outlined with reference to FIG. 3. In this case, the memory elements S"i,j, S"i+1,j of adjacent bit lines BL"i, BL"i+1 which are connected to the same differential amplifier DVi are programmed complementarily.

During read-out, which is effected analogously to the exemplary embodiment outlined with reference to FIG. 3, there is formed on one bit line BL"i the complementary signal of the other bit line BL"i+1. The output voltages Ui, Ui+1 of the operational amplifiers OP"i, OP"i+1 are passed to a differential amplifier DVi, which forms the output signal Yi. Interfering influences attributable to process fluctuations, for example, are thereby eliminated.

We claim:

1. A memory cell configuration, comprising:
   a plurality of word lines running substantially parallel to one another and a plurality of bit lines running substantially parallel to one another and running transversely to said bit lines, each of said word lines forming a respective current path with all of said bit lines during readout;
   memory elements for storing information having a layer structure with a giant magnetoresistive effect, said memory elements being respectively connected between one of said word lines and one of said bit lines and having a higher resistance than said word lines and said bit lines;
   sense amplifiers each connected to a respective bit line for reading the information in a selected one of said memory elements by regulating a potential on each respective bit line to a reference potential and outputting an output signal; and
   a respective word line of said selected memory element having a potential applied thereto to close the current path from said selected word line to all of said bit lines.

2. The memory cell configuration according to claim 1, wherein said sense amplifier has a feedback operational amplifier.

3. The memory cell configuration according to claim 1, wherein:
   said memory elements each have two ferromagnetic layers and a non-magnetic layer arranged between said two ferromagnetic layers;
   an antiferromagnetic layer is disposed adjacent to one of said ferromagnetic layers and determines a polarization direction of a magnetization in the adjacent ferromagnetic layer; and
   said memory elements each have two magnetization states.

4. The memory cell configuration according to claim 3, wherein:
   said ferromagnetic layers each contain at least one element selected from the group consisting of Fe, Ni, Co, Cr, Mn, and Gd;
   a thickness of said ferromagnetic layers is in each case less than or equal to 20 nm;
   said non-magnetic layer contains at least one material selected from the group of materials consisting of $Al_2O_3$, NiO, $HfO_2$, $TiO_2$, NbO, and $SiO_2$, and has a thickness in a range between substantially 1 nm and substantially 4 nm.

5. The memory cell configuration according to claim 1, wherein said memory elements, in a plane spanned by said word lines and said bit lines, are dimensioned in a range between 0.1 $\mu$m×0.1 $\mu$m and 2 $\mu$m×20 $\mu$m.

6. The memory cell configuration according to claim 1, wherein a number of said word lines is greater than a number of said bit lines.

7. The memory cell configuration according to claim 1, which comprises a plurality of substantially parallel write lines, disposed with insulation from said word lines and said bit lines.

8. The memory cell configuration according to claim 1, which comprises threshold value elements with regard to said bit lines, said elements being in each case connected to an output of said sense amplifier.

9. The memory cell configuration according to claim 1, which comprises differential amplifiers each connected to two bit lines, said differential amplifiers having the inputs each connected to a respective output of said sense amplifiers of an associated said bit line.

10. A magnetic RAM, comprising a memory cell configuration including a plurality of word lines running substantially parallel to one another and a plurality of bit lines running substantially parallel to one another and running transversely to said bit lines, each of said word lines forming a respective current path with all of said bit lines during readout; memory elements for storing information having a layer structure with a giant magnetoresistive effect, said memory elements being respectively connected between one of said word lines and one of said bit lines and having a higher resistance than said word lines and said bit lines; sense amplifiers each connected to a respective bit line for reading the information in a selected one of said memory elements by regulating a potential on each respective bit line to a reference potential and outputting an output signal; and a respective word line of said selected memory element having a potential applied thereto to close the current path from said selected word line to all of said bit lines.

11. An associative memory, comprising a memory cell configuration including a plurality of word lines running substantially parallel to one another and a plurality of bit lines running substantially parallel to one another and running transversely to said bit lines, each of said word lines forming a respective current path with all of said bit lines during readout; memory elements for storing information having a layer structure with a giant magnetoresistive effect, said memory elements being respectively connected between one of said word lines and one of said bit lines and having a higher resistance than said word lines and said bit lines; sense amplifiers each connected to a respective bit line for reading the information in a selected one of said memory elements by regulating a potential on each respective bit line to a reference potential and outputting an output signal; a respective word line of said selected memory element having a potential applied thereto to close the current path from said selected word line to all of said bit lines; and threshold value elements with regard to said bit lines, said threshold value elements being in each case connected to an output of a respective sense amplifier.

12. An associative memory, comprising a memory cell configuration including a plurality of word lines running substantially parallel to one another and a plurality of bit lines running substantially parallel to one another and running transversely to said bit lines, each of said word lines forming a respective current path with all of said bit lines during readout; memory elements for storing information having a layer structure with a giant magnetoresistive effect, said memory elements being respectively connected between one of said word lines and one of said bit lines and having a higher resistance than said word lines and said bit lines; sense amplifiers each connected to a respective bit line for reading the information in a selected one of said memory elements by regulating a potential on each respective bit line to a reference potential and outputting an output signal; a respective word line of said selected memory element having a potential applied thereto to close the current path from said selected word line to all of said bit lines; and differential amplifiers each connected to two bit lines, said differential amplifiers having inputs each connected to a respective output of said sense amplifiers of an associated said bit line.

* * * * *